United States Patent [19]

Watterston

[11] Patent Number: 5,800,967
[45] Date of Patent: Sep. 1, 1998

[54] METHOD FOR FABRICATING A PLANAR THIN FILM STRUCTURE

[75] Inventor: James Watterston, Sunnyvale, Calif.

[73] Assignee: AIWA Research and Development, Inc., Fremont, Calif.

[21] Appl. No.: 914,198

[22] Filed: Aug. 18, 1997

Related U.S. Application Data

[63] Continuation of Ser. No. 349,712, Dec. 5, 1994, abandoned.

[51] Int. Cl.$^6$ ............................................. G03F 7/26
[52] U.S. Cl. .................... 430/312; 430/315; 430/325; 430/326; 430/328
[58] Field of Search .................... 430/311, 312, 430/315, 325, 326, 328

[56] References Cited

U.S. PATENT DOCUMENTS

| | | | |
|---|---|---|---|
| 4,731,157 | 3/1988 | Lazzari | 156/643 |
| 4,878,290 | 11/1989 | Masud et al. | 29/603 |
| 4,899,434 | 2/1990 | Roberts | 29/603 |
| 4,933,209 | 6/1990 | Anthony et al. | 427/116 |
| 5,048,175 | 9/1991 | Jursich et al. | 29/603 |
| 5,116,719 | 5/1992 | Gau | 430/313 |
| 5,123,156 | 6/1992 | Meunier et al. | 29/603 |
| 5,137,750 | 8/1992 | Amin et al. | 427/116 |
| 5,200,056 | 4/1993 | Cohen et al. | 205/122 |
| 5,256,249 | 10/1993 | Hsie et al. | 156/656 |
| 5,282,308 | 2/1994 | Chen et al. | 29/603 |
| 5,283,942 | 2/1994 | Chen et al. | 29/603 |
| 5,286,607 | 2/1994 | Brown | 430/313 |
| 5,316,617 | 5/1994 | Kawabe et al. | 156/643 |

FOREIGN PATENT DOCUMENTS

| | | |
|---|---|---|
| 58-095839 | 6/1983 | Japan. |
| 63-065629 | 3/1988 | Japan. |
| 63-268110 | 11/1988 | Japan. |
| 6342507 | 12/1994 | Japan. |
| 7130568 | 5/1995 | Japan. |

OTHER PUBLICATIONS

A. Schlitz and M. Pons, Two Layer Planarization Process, Sep. 85, pp. 507–509.

Ishida, Tahara, and Wada, An Advanced Multi–Layer Resist System For Precise Delineation with Planarization, Mar. 1991, pp. 125–128.

*Primary Examiner*—Christopher G. Young
*Attorney, Agent, or Firm*—Skjerven Morrill, MacPherson, Franklin & Friel, L.L.P.; Ken J. Koestner

[57] ABSTRACT

A method is disclosed for fabricating a substantially planar photoimageable layer atop a first thin film member situated on a substrate. The substrate and first thin film member are covered with a first photoresist layer in one embodiment of the method. An asperity is formed in the first photoresist layer above the first thin film member. The remainder of the first photoresist layer outside of the asperity includes photoresist fields which are in the same plane as the first thin film member when viewed in cross section. The asperity is removed by photoimaging including masking, exposing and developing while the photoresist fields remain. A second photoresist layer is then applied to the resultant structure after the asperity is removed. The portions of the second photoresist layer atop the photoresist fields and the photoresist fields themselves are removed by photoimaging. A second thin film member is thus formed in which the remaining portion of the upper photoresist layer is desirably substantially planar with respect to the thin film member below.

41 Claims, 8 Drawing Sheets

METHOD FOR FABRICATING A PLANAR THIN FILM STRUCTURE

This application is a continuation division of application Ser. No. 08/349,712, filed Dec. 5, 1994, now abandoned.

BACKGROUND OF THE INVENTION

1. Field Of The Invention

This invention relates to thin film devices, and more particularly, to methods for fabricating thin film devices in a fashion which maintains the planarity of the upper layers of thin film devices.

2. Description of Related Art

Figure 1A:
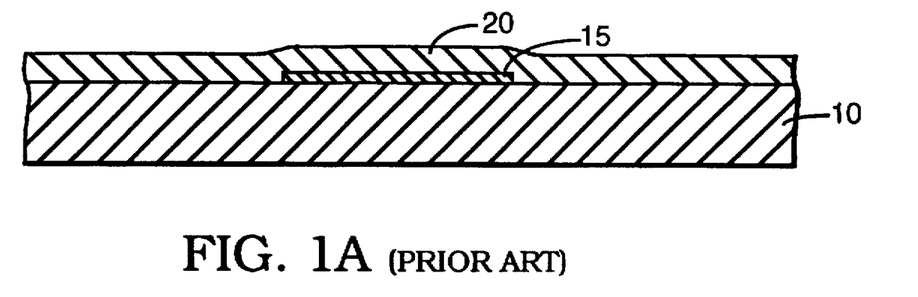
FIG. 1A is a cross sectional view of a low profile thin film member coated with a relatively thin layer of photoresist.

In the fabrication of thin film devices, such as thin film magnetic recording heads for example, it is often desirable to form planar layers of insulative photoimageable material such as photoresist above the lower layers of a particular thin film device. For example, FIG. 1A shows a substrate 10 on which a thin film member 15 is located. Thin film member 15 includes one or more layers. A layer of photoresist 20 is spun on substrate 10 and thin film member 15 as shown in FIG. 1A. Since thin film member 15 exhibits a relatively low vertical profile of approximately 10 microns in this particular example, a generally planar photoresist layer above thin film member 15 results.

Figure 1B:
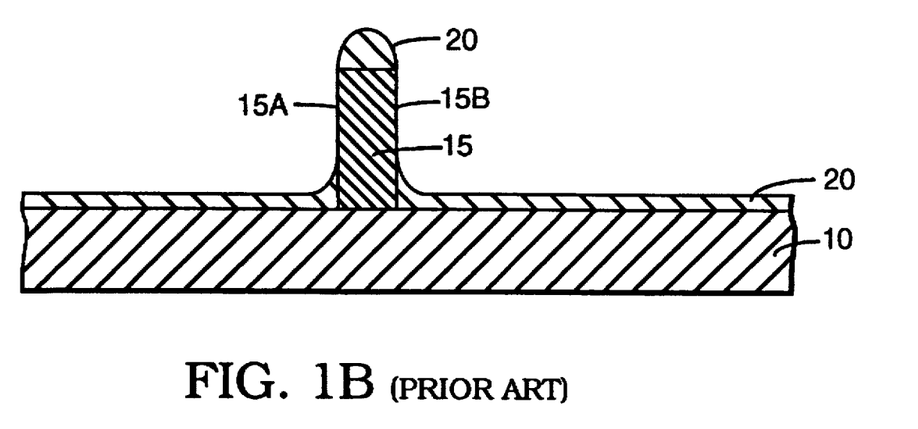
FIG. 1B is a cross sectional view of a high profile thin film member coated with a relatively thin hotoresist layer.

However, when a relatively high vertical profile thin film member is coated with photoresist, a nonplanar photoresist layer often results above the thin film member. For example, FIG. 1B illustrates the situation which occurs when a thin layer 20 of photoresist is applied to a high profile thin film member 15. In this example, thin photoresist layer 20 exhibits a thickness of approximately 5 microns and thin film member 15 exhibits a height of 30 microns. As seen in FIG. 1B, the portion of photoresist layer 20 above thin film member 15 exhibits an undesirable rounded, nonplanar geometry. The coverage above thin film member 15 is irregular and the coverage on the sides 15A and 15B of thin film member 15 is nil toward the top of thin film member 15.

Figure 1C:
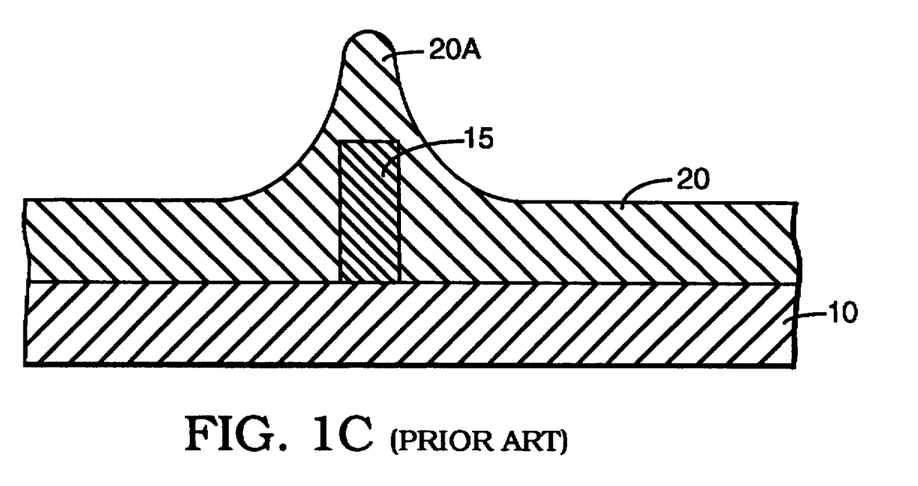
FIG. 1C is a cross sectional view of a high profile thin film member coated with a relatively thick photoresist layer.

Irregular surface coverage problems also occur when high vertical profile thin film member 15 is covered with a thick photoresist layer 20 as shown in FIG. 1C. In the example of FIG. 1C, thick photoresist layer 20 exhibits a thickness of approximately 30 microns. The upper surface of thick photoresist layer 20 is irregular with a significant asperity 20A being present above thin film member 15. Once again, an undesired nonplanar structure results.

In general, the amount of nonplanarity of the resultant structure is dependent on the height of thin film member 15, the aspect ratio (the height of thin film member 15 vs. the relative thickness of photoresist layer 20) and the geometry of the surfaces to be coated. It as been found that generally as the thin film member height and aspect ratio increases, the nonplanarity of the photoresist coating layer correspondingly increases.

One problem with such irregular nonplanar surface coverage is that subsequent layers fabricated an top of the nonplanar surface are consequently also nonplanar. FIGS. 2A–2F illustrate this problem.

Figure 2A:
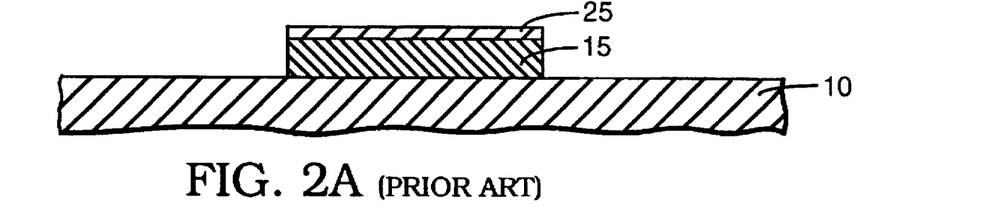
FIG. 2A is a cross sectional view of a substrate including high profile step or member thereon.
Figure 2B:
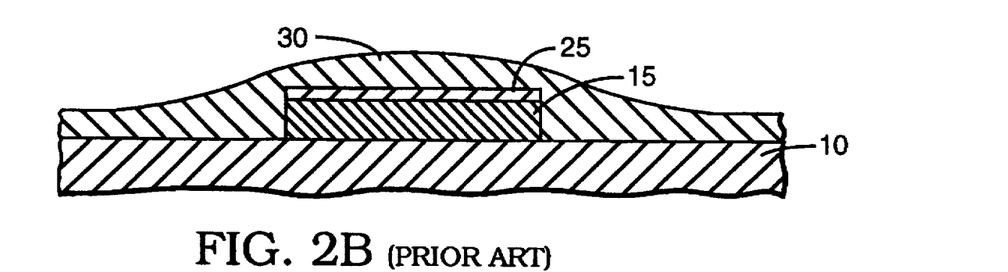
FIG. 2B is a cross sectional view of the structure of FIG. 2A after the application of a layer of photoresist.
Figure 2C:
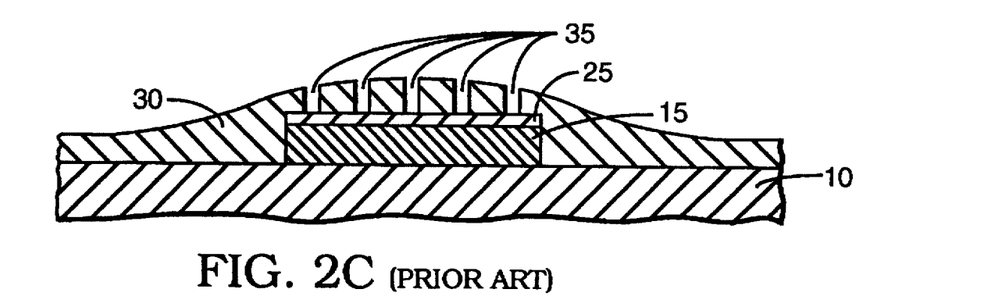
FIG. 2C is a cross sectional view of the structure of FIG. 2D after the structure is photoimaged to create open regions in the photoresist.
Figure 2D:
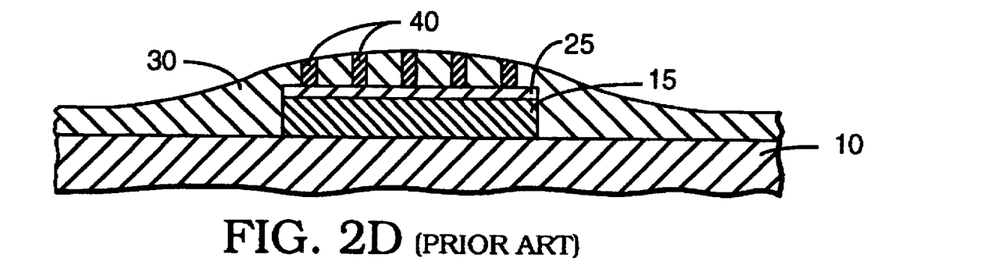
FIG. 2D is a cross sectional view of the structure of FIG. 2C the open regions are plated full with metallic plating material.
Figure 2E:
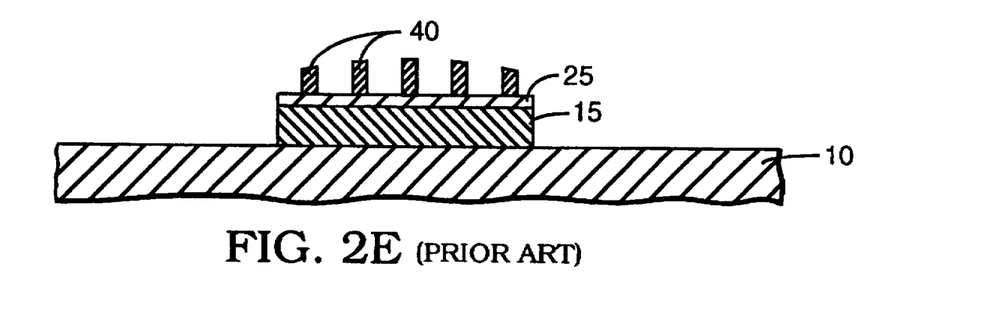
FIG. 2E is a cross sectional view of the structure of FIG. 2D after the photoresist layer is removed.
Figure 2F:
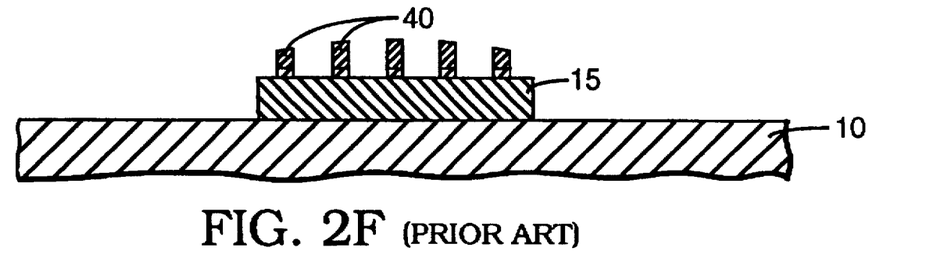
FIG. 2F is a cross sectional view of the structure of FIG. 2E after the exposed portions of the seed layer are removed.

FIG. 2A is a cross sectional view of a substrate 10 on which a relatively high step or thin film member 15 is situated. A seed layer 25 of metallic material is deposited on the upper surface of member 15. A layer of photoresist 30 is then spun onto the structure of FIG. 2A as shown in FIG. 2B. Since member 15 is a relatively high structure, photoresist layer 30 includes a raised portion above member 15 and is thus nonplanar. Photoresist layer 30 is then masked, exposed and developed to form open regions 35 above seed layer 25 as seen in FIG. 2C. The resultant structure is then electroplated so that the open regions 35 fill up with metallic plating material to form coil elements 40 as illustrated in FIG. 2D. Photoresist 30 is then removed with a solvent to form the structure of FIG. 2E. The structure of FIG. 2E is then etched to remove the exposed portions of seed layer 25 to from the structure of FIG. 2F. Coil elements 40 of the structure of FIG. 2F are undesirably nonplanar. This nonplanarity effect is worsened near the edges of the member 15. To help alleviate this undesired nonplanarity effect, the coil elements near the edges of member 15 can be omitted. Unfortunately, valuable surface area is wasted using this approach. It is noted that during plating of coil elements 40, the plating material of the coil elements near the edges of the structure can spill out of open regions 35 to cause shorted coil elements. This nonplanarity effect can thus seriously effect the yield and functionality of thin film structures.

Figure 2G:
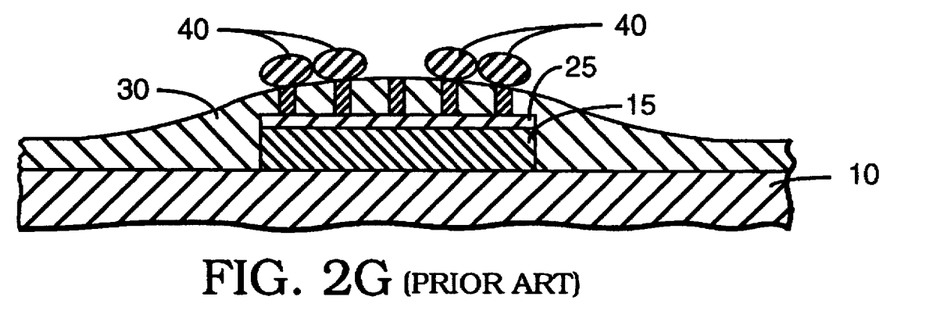
FIG. 2G is a cross sectional view of the structure of FIG. 2D showing the shorting together of plating material from plated coil elements.
Figure 2H:
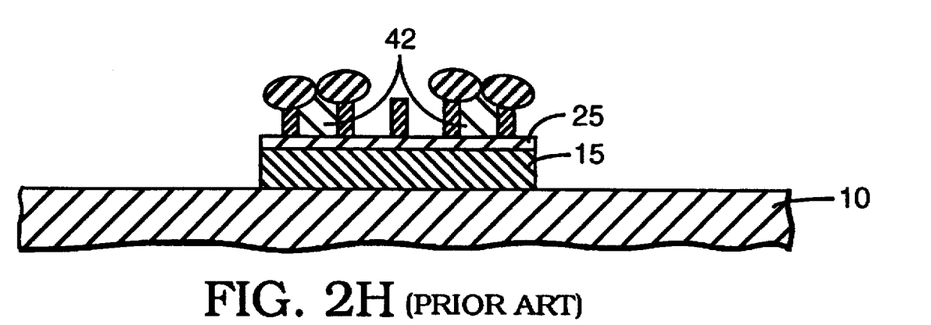
FIG. 2H is a cross sectional view of the structure of FIG. 2G after the photoresist layer is removed showing remaining photoresist due to the shorting together of plating
Figure 2I:
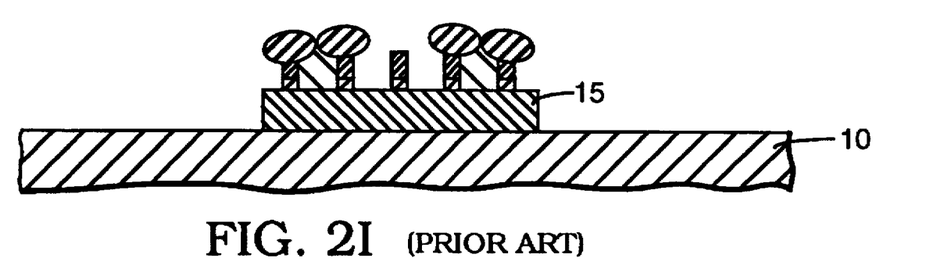
FIG. 2I is a cross sectional view of the structure of FIG. 2H after the exposed portions of the seed layer are removed.

FIG. 2D–2F are simplified cross sections which do not show the aforementioned coil elements as being shorted together. FIGS. 2G–2I are more detailed versions of FIGS. 2D–2F, respectively, which provide additional detail to show the coil elements as being shorted together. More particularly, when open regions 35 are plated full with metallic plating material to form coil elements 40, the plating material tends to "mushroom" out of the top of the outermost open regions 35 and join together as shown in FIG. 2G. Shorted coil elements 40 are thus formed. The structure of FIG. 2G is then subjected to a solvent to remove the photoresist layer. Unfortunately, covered regions 42 of photoresist under the shorted coil elements may not be reachable by the solvent. For this reason, undesired photoresist covered regions 42 remain in the structure of FIG. 2H. The structure of FIG. 2H is then subjected to an etchant to remove the exposed seed layer 25. Unfortunately, after this step, the outer coil elements 40 which experienced the "mushrooming" problem remain shorted. A defective or impaired component thus results.

SUMMARY OF THE INVENTION

One advantage of the method of the present invention is the achievement of a substantially planar layer of photoimageable material above a thin film member.

In accordance with one embodiment of the present invention, a method is provided for fabricating a substantially planar thin film structure. The method includes the step of forming a first thin film member on a substrate, the first thin film member including a substantially planar upper surface and exhibiting a height. The method also includes the step of covering the substrate and the first thin film member with a first photoimageable layer thus forming an asperity in the first photoimageable layer above the first thin film member, a photoimageable field portion being formed by the remainder of the first photoimageable layer, the photoimageable field portion exhibiting a height approximately equal to the height of the thin film member. The method further includes the step of removing the asperity by photoimaging such that the first thin film member is substantially planar with respect to the photoimageable field portion. The method still further includes the step of applying a second photoimageable layer atop the substantially planar first thin film member and photoimageable field portion to form a substantially planar second photoimageable layer. The method also includes the step of removing the portion of the second photoimageable layer atop the photoimageable field portion by photoimaging thus forming a substantially planar remaining upper photoimageable portion atop the thin film member.

DETAILED DESCRIPTION OF THE PREFERRED EMBODIMENT

Figure 3A:
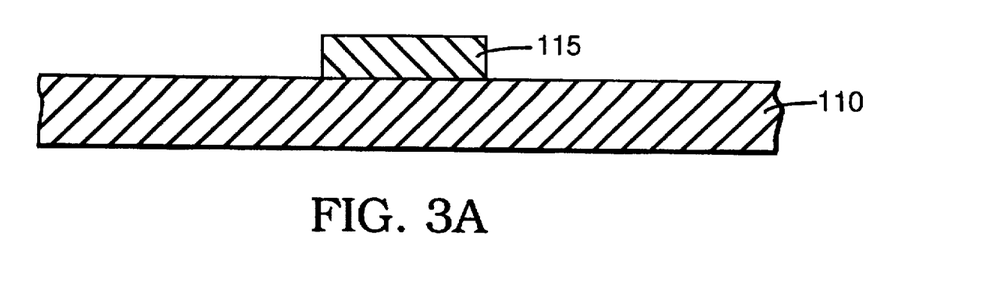
FIG. 3A is a cross sectional view of a substrate with a high profile thin film member thereon.

FIG. 3A shows a substrate 110 on which a thin film member 115 is situated. Materials which can be used as substrate 110 include alumina, silicon or other rigid, substantially flat material exhibiting structural integrity. Thin film member 115 is alternatively referred to as a step in this document. Thin film member 115 can be a single or multi-layer structure. More particularly, thin film member 115 represents any thin film structure above which it is desirable to fabricate a substantially planar layer or layers. For example, thin film member 115 can be as simple as a single layer or as complex as a thin film recording head or other multi-layer structure.

The height, $T_S$, of thin film member 115 is measured using a surface profilometer. For discussion purposes, it is assumed that a typical measured $T_S$ value is approximately 30 microns which corresponds to a relatively high vertical profile thin film member 115. In this particular example the width, $W_S$, of thin film member 115 is approximately 100 microns. These values of $T_S$ and $W_S$ are merely illustrative and should not be taken as being limiting. After $T_S$ is determined, an electrically insulative layer of photoimageable material 120 is deposited above substrate 110 and thin film member 115 as shown. Photoimageable materials which can be used as photoimageable material for layer 120 include photoresist and polyimide. In a preferred embodiment of the method, a positive photoresist is used as layer 120. For simplicity, layer 120 is hereafter referenced as photoresist layer 120. For example, one photoresist which can be used to fabricate layer 120 is AZ4620 photoresist available from Hoechst Celanese. The photoresist which is employed can exhibit electrically insulative properties if desired for a particular application.

Figure 3B:
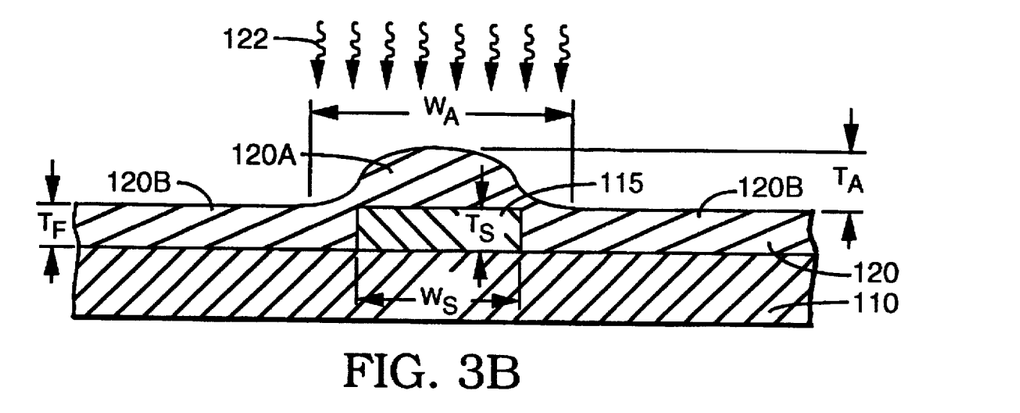
FIG. 3B is a cross sectional view of the structure of FIG. 3A after application of a layer of photoresist.

Photoresist layer 120 is spun onto substrate 110 and thin film member 115 using a conventional photoresist spinning machine. Alternatively, photoresist layer 120 is sprayed onto substrate 110 and thin film member 115. Photoresist layer 120 is applied to a thickness sufficient such that its thickness, $T_F$, substantially matches the thickness of thin film member (or step) 115, namely $T_S$. When photoresist layer 120 is applied in this manner, an asperity 120A in the photoresist material above thin film member 115 results as shown in FIG. 3B. The width of asperity 120A is defined as $W_A$ and the height of asperity 120A is defined as $T_A$. For discussion purposes, it is assumed that $W_A$ and $T_A$ have sample values of 110 microns and 8 microns, respectively. Again, these values are merely illustrative and should not be taking as limiting. The remainder of photoresist layer 120 excluding asperity 120A is designated as photoresist field portions 120B which exhibit a thickness of $T_F$. When viewed in cross section as in FIG. 3B, photoresist layer 120 includes two field portions 120B which are divided by asperity 120A. In actual practice, when viewed from the top, the remainder of photoresist layer 120 excluding asperity 120A may form a single field portion.

Photoresist layer 120 is deposited to a thickness sufficient such that the thickness, $T_F$, of photoresist field portions 120B is equal to the thickness, $T_S$, of thin film member 115 to within approximately plus or minus 10%. For example, for a thin film member or step 115 exhibiting a thickness, $T_S$, of 30 microns, photoresist layer 120 is deposited until the thickness, $T_F$, of photoresist field portions 120B is within plus or minus 2–3 microns of the thickness of thin film member 115. In the ideal case, the thickness, $T_S$, of thin film member 115 is equal to the thickness, $T_F$, of photoresist field portions 120B.

While in some instances, a single coat of photoresist can be used to form photoresist layer 120 to a sufficient thickness, in cases where thin film member 115 is especially thick or tall, multiple photoresist coats are necessary to build photoresist layer 120 up to a height such that the photoresist field portions 120B of photoresist layer 120 match the height of thin film member 115. It is noted that typically the thickness, $T_A$, of the photoresist asperity 120A is less than the thickness, $T_F$, of photoresist field portions 120B.

The portion of photoresist layer 120 above thin film member 115, namely asperity 120A, is now exposed to ultraviolet light 122 using a mask. The structure of FIG. 3B is then developed, thus removing asperity 120A and leaving the substantially planar structure of FIG. 3C. More specifically, the structure of FIG. 3C includes a substantially planar upper surface 125 formed by thin film member 115 and photoresist field portions 120B. These masking, exposing and developing steps are referred to cumulatively as photoimaging.

In the above described masking/exposing/developing steps, it is important that as much of asperity 120A be removed as possible. Thus, in the case where photoresist layer 120 is made of positive photoresist, as much of asperity 120A as possible is exposed to permit all of asperity 120A to be removed by the developer. If the mask opening through which ultraviolet light passes during exposure is the same width as the width, $W_S$, of thin film member 115, then only the portion of photoresist layer 120 immediately above thin film member 115 would be removed. This results in the still nonplanar structure of FIG. 3D which includes undesired leftover asperity side vestiges 120C and 120D. To avoid this undesired nonplanar result, the mask opening is somewhat wider than the width, $W_S$, of thin film member 115. More particularly, the mask opening is substantially equal to and vertically aligned with the width, $W_A$, of asperity 120A. Generally, the width of the mask opening is equal to $W_S$ plus delta wherein delta is equal to approximately 10–15% of $W_S$.

Figure 3C:
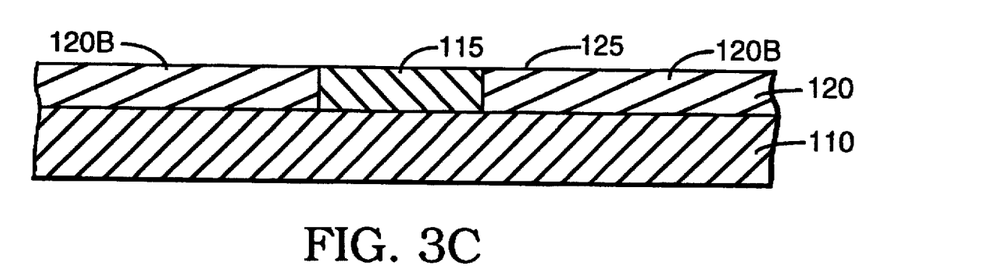
FIG. 3C is a cross sectional view of the structure of FIG. 3B after removal of the asperity in the photoresist.
Figure 3D:
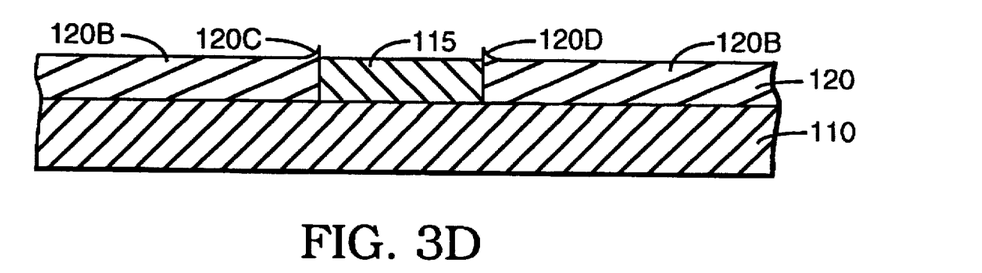
FIG. 3D is a cross sectional view of the structure of FIG. 3B after removal of a portion of the asperity in the photoresist.

At this point in the process, upper surface 125 is optionally subjected to a flood exposure of ultraviolet light to help condition the photoresist in photoresist field portions 120B for future removal with developer. No mask is used in this flood exposure step. This optional "pre-exposure" step is not required but it simplifies subsequent removal of photoresist field portions 120B.

Figure 3E:
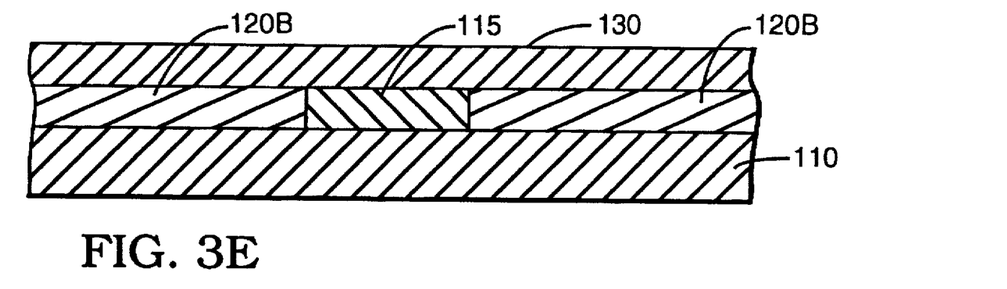
FIG. 3E is a cross sectional view of the structure of FIG. 3C after application of an upper photoresist layer.
Figure 3F:
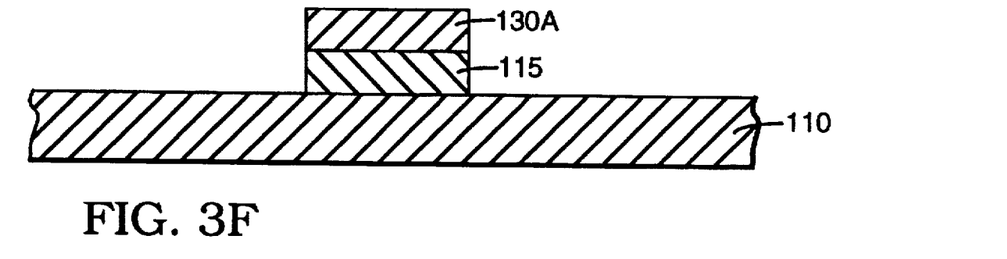
FIG. 3F is a cross sectional view of the structure of FIG. 3E after removal of photoresist material except for that above the thin film member thus resulting in a substantially planar structure.

An upper photoresist layer 130 is then spun, sprayed or otherwise deposited onto the structure of FIG. 3C as shown in FIG. 3E. It is noted that this photoresist layer 130 is substantially planar. The upper surface of photoresist layer 130 is then masked to expose the portions of photoresist layer 130 immediately above photoresist field portions 120B to ultraviolet light. In this masking step, the portion of upper photoresist layer 130 immediately above thin film member 115 is masked off to prevent exposure of this area. The structure of FIG. 3E is then exposed and developed. If photoresist field portions 120B were already exposed in the previously described optional pre-exposure step, then the exposed portions of upper photoresist layer 130 together with photoresist field portions 120B are all removed at the same time by the developer. However, if the optional exposure step was omitted and if the structure is particularly thick, then another exposure step may be needed to expose photoresist field portions 120B after the exposed portions of upper photoresist layer 130 are removed. The exposed photoresist field portions 120B are then developed and removed. These masking, exposure and developing steps result in the removal of photoresist field portions 120B and the portions of upper photoresist layer 130 above photoresist field portions 120B as shown in FIG. 3F. The portion of upper photoresist layer 130 which remains above thin film member 115 is designated as remaining upper photoresist portion 130A.

Figure 3G:
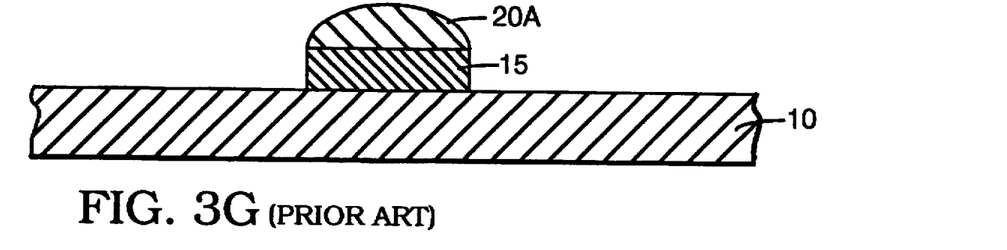
FIG. 3G is a cross sectional view of the conventional structure of FIG. 1C after removal of photoresist material except for that above the thin film member thus resulting in a nonplanar structure.

As seen in FIG. 3F, upper photoresist portion 130A is substantially planar. This is to be contrasted with the result of conventional processes depicted in FIG. 3G. FIG. 3G shows the result achieved when the structure of FIG. 1C is masked to expose photoresist layer 20 except for the portion 20A above thin film member 15. The structure of FIG. 1C is then developed to remove photoresist layer 20 except for portion 20A. The resultant photoresist layer portion 20A above thin film member 15 is rounded and nonplanar. This undesired condition presents problems in fabricating subsequent upper layers above nonplanar portion 20A and problems in fabricating planar layers within nonplanar portion 20A.

Figure 4:
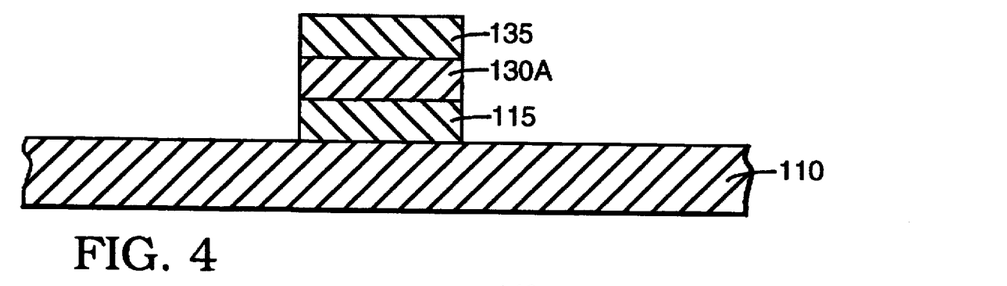
FIG. 4 is a cross sectional view of the structure of FIG. 3F after an additional layer or structure is formed on the remaining portion of the upper photoresist layer.

The substantially planar result achieved for upper photoresist portion 130A of FIG. 3F can be now used for two different applications. In one embodiment, photoresist portion 130A is cross-linked and cured by high temperature baking or by exposure to a high energy electron beam. In this manner, upper photoresist portion 130A provides a planar stable base for the formation of subsequent upper thin film or other structures atop upper photoresist portion 130A. As seen in FIG. 4 such a subsequent upper thin film structure is shown as structure 135. In actual practice, structure 135 can be a single layer or a multilayer patterned or unpatterned structure.

Figure 5:
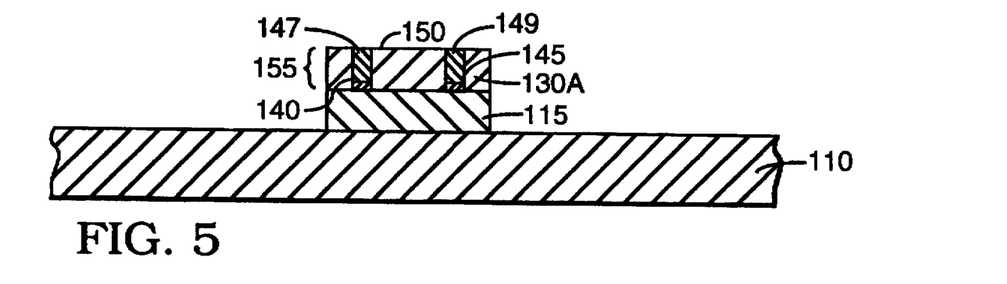
FIG. 5 is a cross sectional view of the structure of FIG. 3F after additional thin film assemblies or structures are formed within the upper photoresist layer.

In an alternative embodiment depicted in FIG. 5, photoresist portion 130A is photoimaged as part of the process of forming other structures within photoresist portion 130A. For example, photoresist portion 130A is photoimaged to form open regions 140 and 145. Open regions 140 and 145 are plated with electrically conductive metal such as NiFe or Cu, for example, to connect with structures below (not shown) in thin film member 115. Metallic members 147 and 149 are thus formed in open regions 140 and 145, respectively. The upper surface 150 of the resultant structure is desirably planar using the disclosed process. A thin film assembly 155 is thus formed in photoresist portion 130A. This description of photoresist portion 130A is intended to be illustrative of the many different types of thin film assemblies or structures which can be formed within photoresist portion 130A by photoimaging, plating, etching and other processes. The resultant thin film assembly 155 of FIG. 5 desirably achieves a planar upper surface 150 formed by the upper surfaces of metal members 147 and 149 and photoresist portion 130A. It is noted that in actual practice, when photoimaging, plating or etching photoresist portion 130A to form a thin film assembly therein, the removal of photoresist field portions 120B is delayed until after such plating or etching.

Figure 6A:
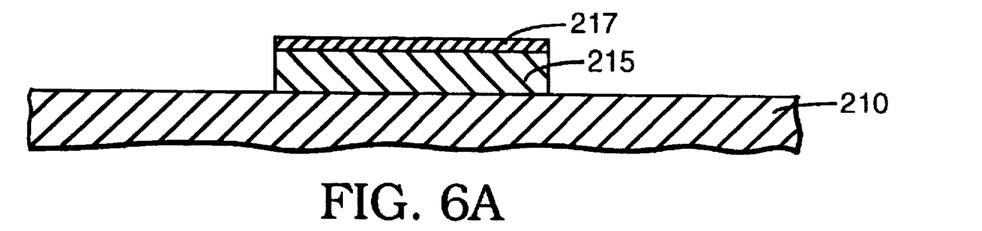
FIG. 6A is a cross sectional view of substrate with a high profile thin film member thereon.

FIGS. 6A–6H show in more detail this alternative embodiment wherein a planar thin film member including thin film structures is formed atop a step or thin film member. The process set forth in FIGS. 6A–6H is similar to the earlier described process of FIGS. 3A–3F except for the modifications now discussed. FIG. 6A shows a substrate 210 on which a thin film member 215 is situated. Substrate 210 and thin film member 215 are similar in construction to substrate 110 and thin film member 115 of FIG. 2A. A seed layer 217 of an electrically conductive material is sputtered on substrate surface 210. Seed layer 217 is fabricated from a material which is suitable for the plating of subsequent metallic layers thereon. For example, seed layer 210 may be fabricated from Cr-NiV, namely, a chrome or other adhesion-promoting layer followed by a non-magnetic nickel-vanadium 7% film. Seed layer 210 need only be a relatively thin layer sufficient to act as a seed for subsequent plating. For example, a seed layer which is 0.1 µ in thickness is sufficient.

Figure 6B:
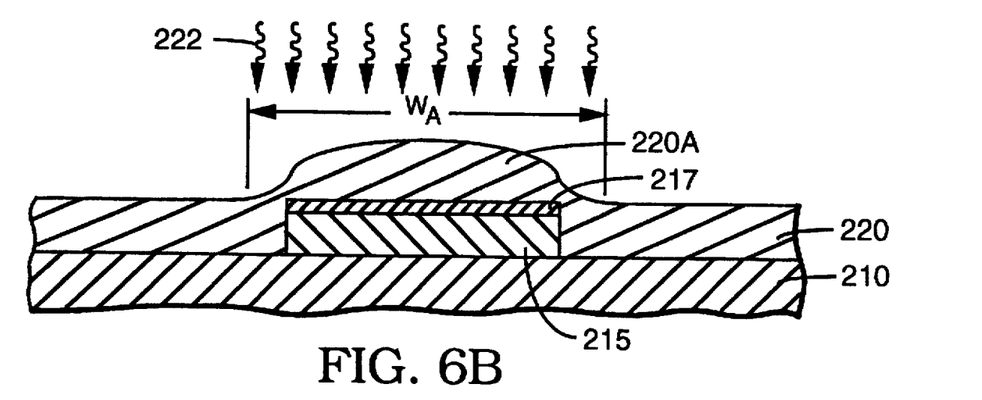
FIG. 6B is a cross sectional view of the structure of FIG. 6A after application of a layer of photoresist.
Figure 6C:
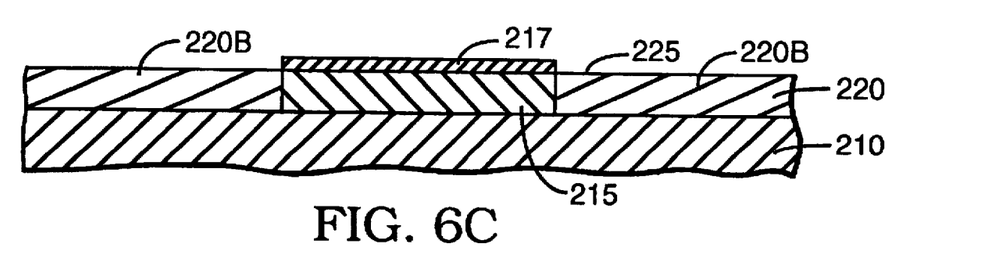
FIG. 6C is a cross sectional view of the structure of FIG. 6B after the asperity in the photoresist layer is removed.

As shown in FIG. 6B, a layer of photoresist 220 is spun onto the structure of FIG. 6A. An asperity 220A in the photoresist layer is formed above thin film member 215. In a manner similar to that described with reference to FIG. 3B, photoresist layer 220 is masked to expose asperity 220 to ultraviolet light 222 while leaving the remainder of the photoresist layer unexposed. The structure is then developed to remove asperity 220A, thus resulting in the structure illustrated in FIG. 6C. The upper surface 225 of the structure of FIG. 6C is substantially planar. It is noted that field portions 220B of photoresist layer 220 remain around thin film member 215.

At this point in the process flow, upper surface 225 is optionally subjected to a flood exposure of ultraviolet light to help condition the photoresist in photoresist field portions 220B for future removal with developer. No mask is used in this flood exposure step. This step is not required; however, it simplifies subsequent removal of photoresist field portions 220B.

Figure 6D:
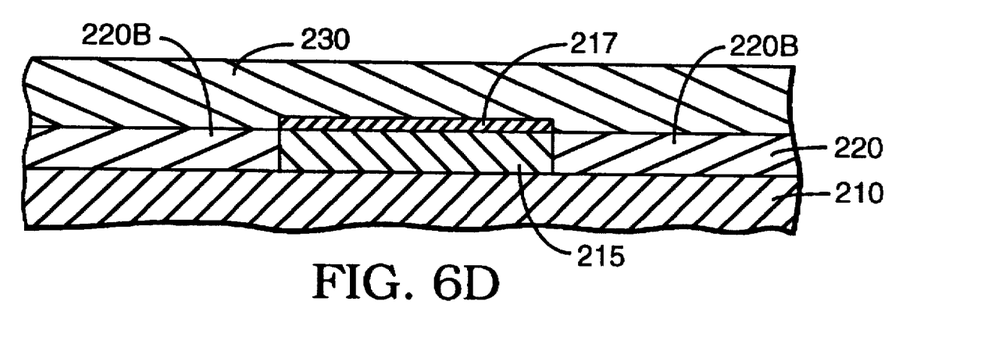
FIG. 6D is a cross sectional view of the structure of FIG. 6C after an upper photoresist layer is deposited atop the structure.

An upper photoresist layer 230 is then spun, sprayed or otherwise deposited onto the structure of FIG. 6C to form the structure shown in FIG. 6D. It is noted that this photoresist layer 230 is substantially planar. In the subsequent process steps, a thin film structure will be formed within the portion of photoresist layer 230 above thin film member 215. To accomplish this, the upper surface of photoresist layer 230 is masked to expose portions of the photoresist layer 230 immediately above thin film member 215 and to shield the remainder of photoresist layer 230. In this particular example, a coil structure is formed within the portion of photoresist layer 230 above thin film member 215. The coil elements 240 of this coil structure are depicted later in FIG. 6F. In the masking step associated with FIG. 6D, the portion of photoresist layer 230 above thin film member 215 is masked to include openings to expose this portion of the photoresist layer at locations where open regions 245 will be formed in a subsequent developing step. The masked structure is then exposed and developed to form the structure of FIG. 6E which includes open regions 245.

Figure 6E:
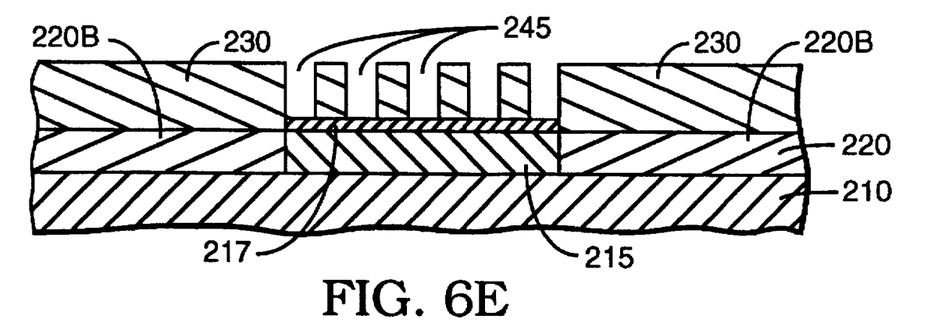
FIG. 6E is a cross sectional view of the structure of FIG. 6D after open regions are formed in the upper photoresist layer by photoimaging.
Figure 6F:
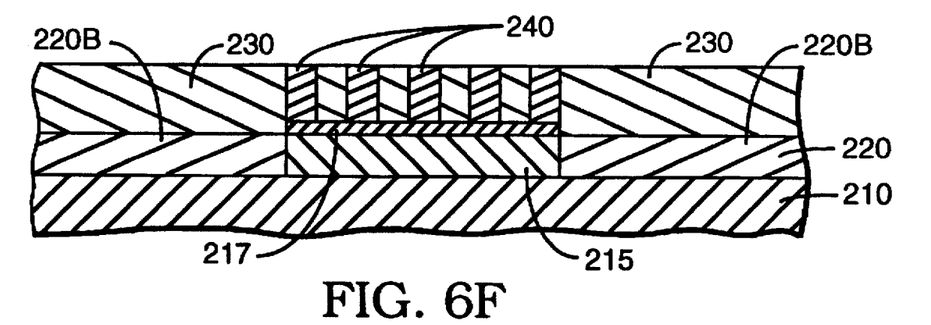
FIG. 6F is a cross sectional view of the structure of FIG. 6E after the open regions are plated full with electrically conductive material.

The structure of FIG. 6E is then plated with metallic material, such as copper (Cu) for example, to fill open regions 245 thus forming coil elements 240 as shown in FIG. 6F. The structure of FIG. 6F is then flood exposed to ultraviolet light. Exposed photoresist layer 230 is then removed by developer. If photoresist field portions 220B were already exposed in the previously described optional exposure step, this "pre-exposure" action facilitates the removal of photoresist field portions 220B at the same time that the exposed portions of upper photoresist layer 230 are removed by the developer. However, if the "pre-exposure" step was not performed and if the structure is particularly thick, then after developing as described above, it may be necessary to re-expose and re-develop to fully remove photoresist field portions 220B.

Figure 6G:
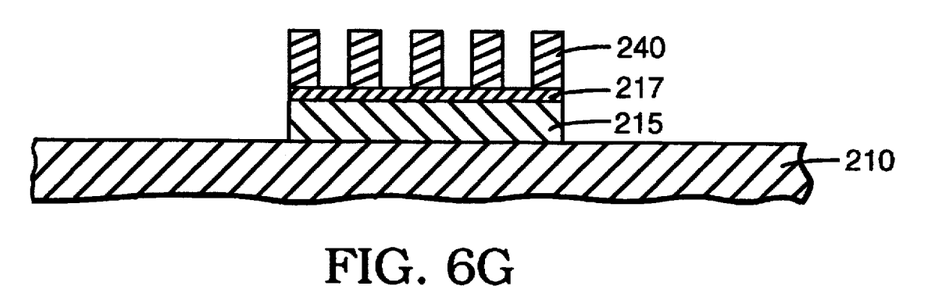
FIG. 6G is a cross sectional view of the structure of FIG. 6F after the photoresist layer is removed.
Figure 6H:
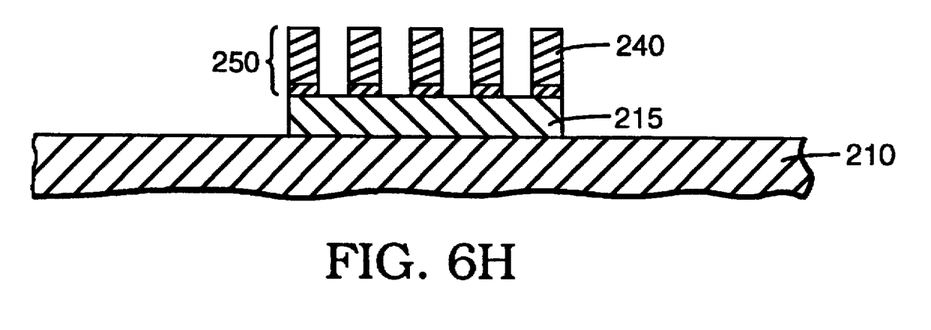
FIG. 6H is a cross sectional view of the structure of FIG. 6G after the exposed portions of the seed layer are removed.

The structure of FIG. 6G is then subjected to a selective etchant, such as ammonium persulfate, for example, to remove the exposed portions of seed layer 217 thus forming the structure of FIG. 6H. A substantially planar thin film structure 250 including coil elements 240 is thus formed above thin film member 215. It should be understood that thin film structure 250 can include other thin film elements as well in addition to coil elements 240. For example, thin film structure 250 can include photoresist, insulation, connective metallic runners, and magnetic poles.

While elements 240 have been referred to as coil elements, it should be understood that in actual practice these coil elements 240 may form a portion of a larger coil structure. Additional layers atop thin film structure 250 can be used to form any remaining portions of such a coil structure. The purpose of FIG. 6A–6H is to illustrate how a sample planar thin film structure, such as thin film structure 250, can be fabricated atop thin film member 215. Many other types of thin film structures other than the particular thin film structure 250 can be fabricated atop thin film member 215 in a planar fashion using the techniques described herein.

Figure 7:
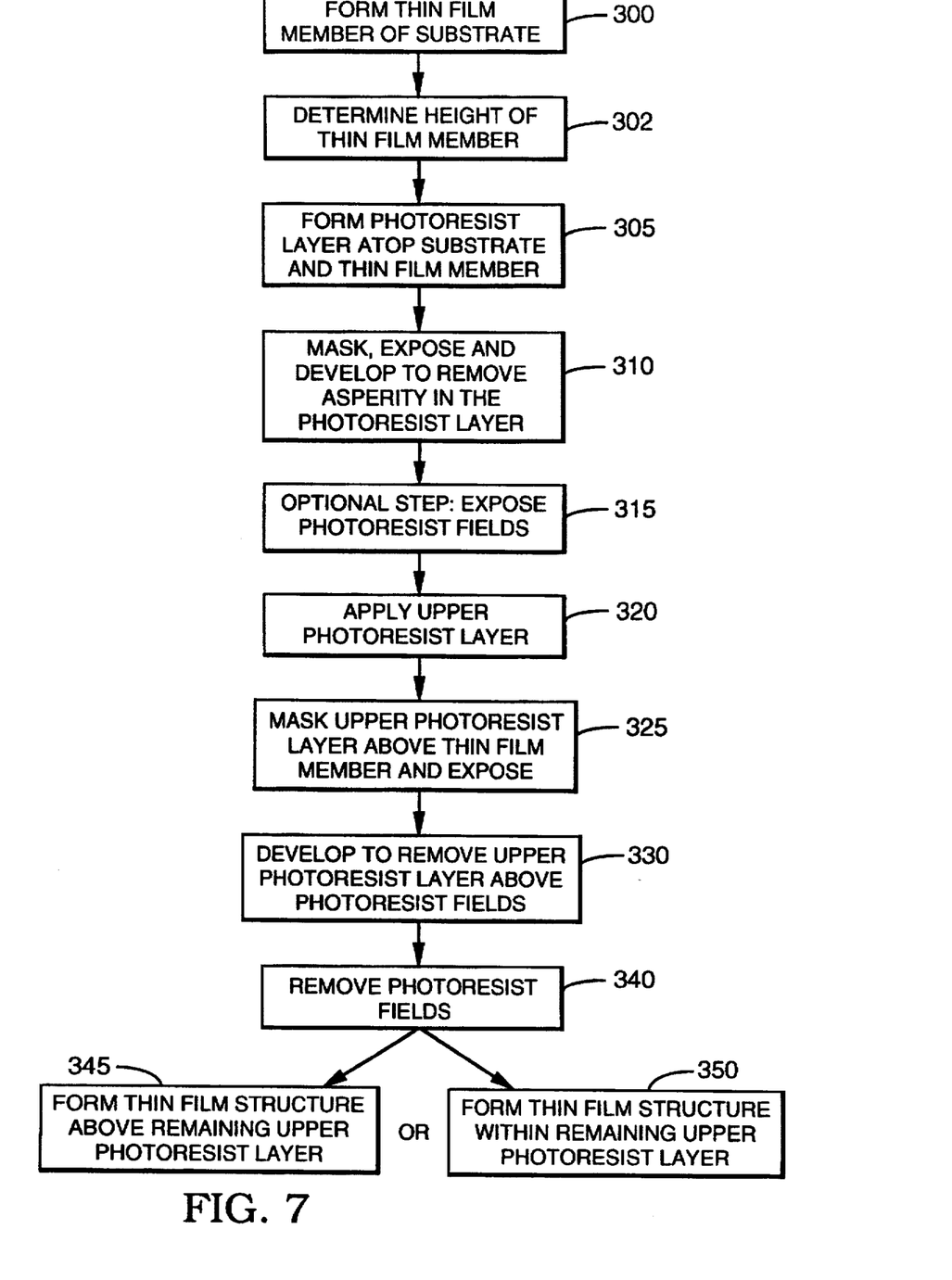
FIG. 7 is a flow chart depicting the process steps in one embodiment of the disclosed method.

FIG. 7 is a flow chart of the steps of one embodiment of the disclosed method. In this particular embodiment, process flow starts at block 300 at which thin film member 115 is formed on substrate 110. The height of thin film member 115 is then determined at block 302. A photoresist layer 120 is then formed above substrate 110 and thin film member 115 as per block 305. The resultant structure is then masked, exposed to ultraviolet light and developed to remove the asperity form above thin film member 115 as per block 310. Block 310 is a photoimaging step. An optional step is specified in block 315 which provides for exposing the photoresist fields 120B at this point in the process flow as opposed to later after portions of the upper photoresist layer 130 are removed. Process flow then continues to block 320 at which upper photoresist layer 130 is formed. The upper photoresist layer 130 is then masked above thin film member 115 and exposed to ultraviolet light as per block 325. In this manner, the portion of upper photoresist layer 130 above photoresist fields 120B is exposed while the portion of upper photoresist layer 130 above thin film member 115 is not exposed. The resultant structure is then developed to remove the portions of the upper photoresist layer 130 above photoresist fields 120B as per block 330. If the optional step 315 was not carried out, then after block 330 it is necessary to expose photoresist fields 120 while maintaining the mask above the portion of upper photoresist layer 130 above thin film member. Photoresist fields 120B are then removed by developer in block 340. At this point at least two options are possible. As per block 345, the remaining upper photoresist portion 130A atop thin film member 115 is cross-linked and cured to create a substantially planar base on which a subsequent thin film structure 135 is formed. Alternatively, as per block 350, a thin film structure is formed within the remaining upper photoresist portion 130A by photoimaging, etching, plating or a combination of these or other thin film techniques. Such a thin film structure can also be formed atop thin film member 315 in place of the remaining upper photoresist layer.

In this manner, the disclosed method provides for the formation of a substantially planar layer of photoimageable material above a thin film member situated on a substrate. The uniformity, quality and reliability of thin film structures is significantly enhanced by application of this method.

While only certain preferred features of the invention have been shown by way of illustration, many modifications and changes will occur. It is, therefor, to be understood that the present claims are intended to cover all such modifications and changes which fall within the true spirit of the invention.

What is claimed is:

1. A method of fabricating a substantially planar thin film structure comprising the steps of:
   forming a first thin film member on a substrate, the thin film member including a substantially planar upper surface and exhibiting a height;
   determining the height of the first thin film member;
   covering the substrate and the first thin film member with a first photoimageable layer thus forming an asperity in the first photoimageable layer above the first thin film member, a photoimageable field portion being formed by the remainder of the first photoimageable layer, the photoimageable field portion exhibiting a height approximately equal to the height of the first thin film member;
   removing the asperity by photoimaging such that the first thin film member is substantially planar with respect to the photoimageable field portion; and
   applying a second photoimageable layer atop the substantially planar first thin film member and photoimageable field portion to form a substantially planar second photoimageable layer.

2. The method of claim 1 further comprising the step of removing the portion of the second photoimageable layer atop the photoimageable field portion by photoimaging thus forming a substantially planar remaining upper photoimageable portion atop the first thin film member.

3. The method of claim 1 further comprising the step of removing the photoimageable field portion by photoimaging.

4. The method of claim 2 further comprising the step of:
   exposing the remaining upper photoimageable portion;
   developing the remaining upper photoresist portion; and
   forming a second thin film member atop the remaining upper photoimageable portion.

5. The method of claim 2 further comprising the step of:
   forming a thin film assembly within the remaining upper photoimageable portion.

6. The method of claim 1 wherein the covering the substrate step includes applying photoimageable material to the substrate and first thin film member until the height of the photoimageable field portion is within approximately 10% of the height of the first thin film member.

7. The method of claim 1 wherein the covering the substrate step includes covering the substrate and the first thin film member with positive photoimageable material.

8. The method of claim 7 further comprising the step of masking the first photoimageable layer with a mask having an opening which is wider than the width of the first thin film member by approximately 15%.

9. The method of claim 8 further comprising the step of exposing the first photoimageable layer though the mask.

10. The method of claim 9 further comprising the step of developing the first photoimageable layer to remove the asperity.

11. The method of claim 2 wherein the removing the portion of the second photoimageable layer atop the photoimageable field portion by photoimaging step includes masking the portion of the second photoimageable layer above the first thin film member to prevent removal thereof.

12. The method of claim 11 further comprising the step of exposing the second photoimageable layer except for the portion of the second photoimageable layer above the first thin film member.

13. The method of claim 12 further comprising the step of developing the second photoimageable layer to remove the portion of the second photoimageable layer atop the field portion.

14. The method of claim 1 further comprising the step of exposing the photoimageable field portion after the removing the asperity step and prior to the applying a second photoimageable layer step.

15. A method of fabricating a substantially planar thin film structure comprising the steps of:
   forming a first thin film member on a substrate, the thin film member including a substantially planar upper surface and exhibiting a height;
   determining the height of the first thin film member;
   covering the substrate and the first thin film member with a first photoresist layer thus forming an asperity in the first photoresist layer above the first thin film member, a photoresist field portion being formed by the remainder of the first photoresist layer, the photoresist field portion exhibiting a height approximately equal to the height of the first thin film member,
   removing the asperity by photoimaging such that the first thin film member is substantially planar with respect to the photoresist field portion;
   applying a second photoresist layer atop the substantially planar first thin film member and photoresist field portion;
   removing the portion of the second photoresist layer atop the photoresist field portion by photoimaging thus forming a substantially planar remaining upper photoresist portion atop the thin film member; and
   removing the photoresist field portion by photoimaging.

16. The method of claim 15 further comprising the step of:
   exposing the remaining upper photoresist portion;
   developing the remaining upper photoresist portion; and
   forming a second thin film member atop the remaining upper photoresist portion.

17. The method of claim 15 further comprising the step of:
   forming a thin film assembly within the remaining upper photoresist portion.

18. The method of claim 15 wherein the covering the substrate step includes applying photoresist to the substrate and first thin film member until the height of the photoresist field portion is within approximately 10% of the height of the first thin film member.

19. The method of claim 15 wherein the covering the substrate step includes covering the substrate and the first thin film member with positive photoresist.

20. The method of claim 19 further comprising the step of masking the first photoresist layer with a mask having an opening which is wider than the width of the first thin film member by approximately 15%.

21. The method of claim 20 further comprising the step of exposing the first photoresist layer though the mask.

22. The method of claim 21 further comprising the step of developing the first photoresist layer to remove the asperity.

23. The method of claim 15 wherein the removing the portion of the second photoresist layer atop the photoresist field portion by photoimaging step includes masking the portion of the second photoresist layer above the first thin film member to prevent removal thereof.

24. The method of claim 23 further comprising the step of exposing the second photoresist layer except for the portion of the second photoresist layer above the first thin film member.

25. The method of claim 24 further comprising the step of developing the second photoresist layer to remove the portion of the second photoresist layer atop the field portion.

26. The method of claim 15 further comprising the step of exposing the photoresist field portion after the removing the asperity step and prior to the applying a second photoresist layer step.

27. A method of fabricating a planar thin film structure comprising the steps of:

forming a first thin film member on a substrate, the thin film member including a substantially planar upper surface and exhibiting a height;

determining the height of the first thin film member;

covering the substrate and the first thin film member with a first photoimageable layer thus forming an asperity in the first photoimageable layer above the first thin film member, a photoimageable field portion being formed by the remainder of the first photoimageable layer, the photoimageable field portion exhibiting a height approximately equal to the height of the first thin film member;

removing the asperity by photoimaging such that the first thin film member is substantially planar with respect to the photoimageable field portion; and forming a second thin film member above the first thin film member where the asperity was removed.

28. The method of claim 27 wherein the forming a second thin film member step comprises applying a second photoimageable layer atop the substantially planar first thin film member and photoimageable field portion to form a substantially planar second photoimageable layer.

29. The method of claim 28 further comprising the step of photoimaging the second photoimageable layer to form open regions therein.

30. The method of claim 29 further comprising the step of forming thin film structures in the open regions.

31. The method of claim 28 further comprising the step of forming a seed layer atop the first thin film member prior to the covering the substrate step.

32. The method of claim 31 wherein the forming a second thin film member step comprises applying a second photoimageable layer atop the seed layer and photoimageable field portion to form a substantially planar second photoimageable layer.

33. The method of claim 32 further comprising the step of photoimaging the second photoimageable layer to form open regions therein.

34. The method of claim 33 further comprising the step of electroplating the open regions using the seed layer as a seed to form plated elements in the open regions.

35. The method of claim 34 further comprising the step of removing the second photoimageable layer.

36. The method of claim 35 wherein the seed layer includes exposed portions between the plated elements, the method further comprising etching the seed layer to remove the exposed portions of the seed layer.

37. The method of claim 27 wherein the covering the substrate step includes applying photoimageable material to the substrate and first thin film member until the height of the photoimageable field portion is within approximately 10% of the height of the first thin film member.

38. The method of claim 27 wherein the covering the substrate step includes covering the substrate and the first thin film member with positive photoimageable material.

39. The method of claim 38 further comprising the step of masking the first photoimageable layer with a mask having an opening which is wider than the width of the thin film member by approximately 15%.

40. The method of claim 39 further comprising the step of exposing the first photoimageable layer though the mask.

41. The method of claim 40 further comprising the step of developing the first photoimageable layer to remove the asperity.

* * * * *